United States Patent [19]

Takahashi

[11] 4,160,176
[45] Jul. 3, 1979

[54] ELECTRONIC WATCH
[75] Inventor: Norio Takahashi, Tokyo, Japan
[73] Assignee: Kabushiki Kaisha Daini Seikosha, Japan
[21] Appl. No.: 826,986
[22] Filed: Aug. 23, 1977
[30] Foreign Application Priority Data
Aug. 23, 1976 [JP] Japan .................. 51-100429
[51] Int. Cl.² .................. H03K 3/353; H03K 5/18; G08B 21/00
[52] U.S. Cl. .................. 307/362; 58/23 BA; 58/152 H; 307/200 B; 307/304; 340/636; 340/663
[58] Field of Search ............ 307/200 B, 304, 296 R, 307/296 A, 350, 362, 363; 58/23 A, 23 BA, 152 H; 340/248 B, 249; 330/253, 264, 277

[56] References Cited
U.S. PATENT DOCUMENTS

| 3,628,070 | 12/1971 | Heuner et al. ............ 307/304 |
| 3,898,790 | 8/1975 | Takamune et al. ........ 340/248 B X |
| 3,949,545 | 4/1976 | Chihara ................... 58/23 BA |
| 3,999,368 | 12/1976 | Yoshida ................... 58/23 BA |
| 4,001,808 | 1/1977 | Ebihara et al. .......... 340/248 B X |
| 4,024,415 | 5/1977 | Matsuura ................. 307/362 |
| 4,032,864 | 6/1977 | Yamashiro et al. ...... 330/277 X |
| 4,037,399 | 7/1977 | Chihara ................... 58/23 BA |
| 4,041,691 | 8/1977 | Chihara et al. .......... 58/152 H X |
| 4,043,112 | 8/1977 | Tanaka .................... 58/23 BA |
| 4,074,515 | 2/1978 | Asano ...................... 58/23 BA |

Primary Examiner—Larry N. Anagnos
Attorney, Agent, or Firm—Robert E. Burns; Emmanuel J. Lobato; Bruce L. Adams

[57] ABSTRACT

A circuit for detecting battery voltage for example in an electronic watch in order to provide a warning that the battery is almost depleted comprises two NOT circuits connected across the battery terminals. Each of the NOT circuits comprises a P-channel MOS transistor and an N-channel MOS transistor. The output of the first NOT circuit is connected to the input of the second NOT circuit and also through a biasing resistance to the input of the first NOT circuit. The output of the second NOT circuit is connected to circuitry for presenting a visual display when the output is inverted. When the voltage of the battery drops below a predetermined level, the output of the second NOT circuit is inverted to provide an indication that the battery is nearing depletion.

7 Claims, 9 Drawing Figures

U.S. Patent  Jul. 3, 1979  4,160,176
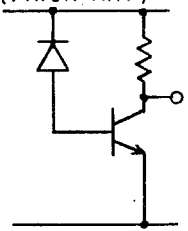
FIG.1 (PRIOR ART)
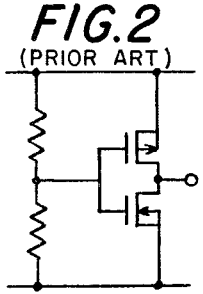
FIG.2 (PRIOR ART)
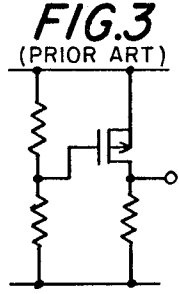
FIG.3 (PRIOR ART)
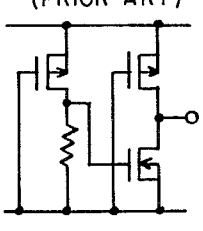
FIG.4 (PRIOR ART)
FIG.5
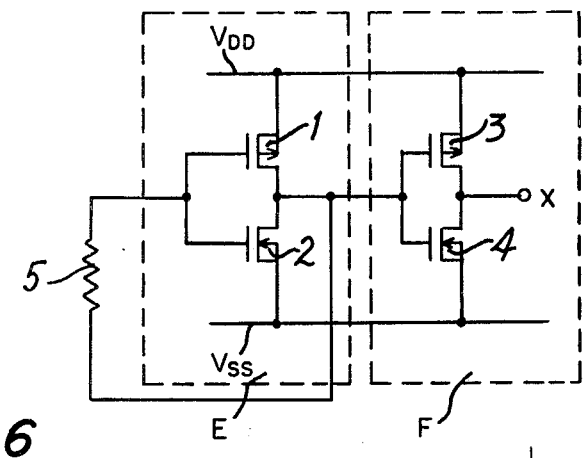
FIG.6
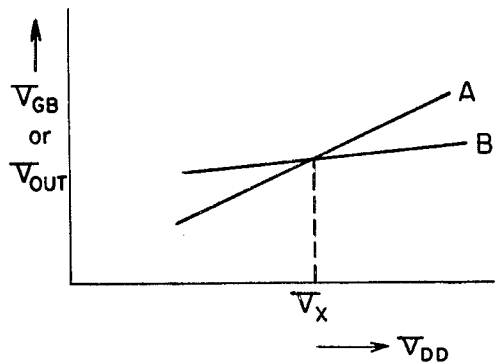
FIG.7
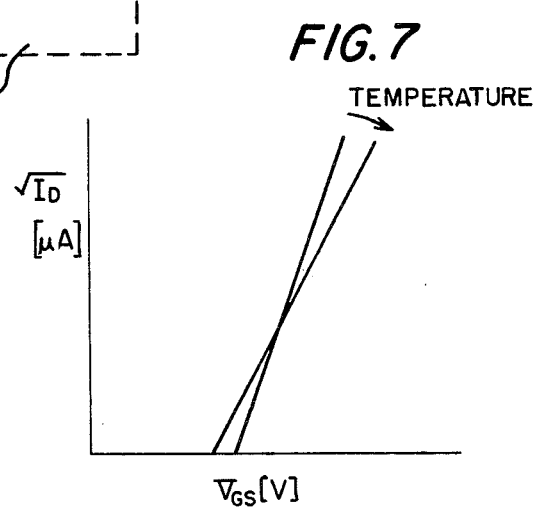
FIG.8
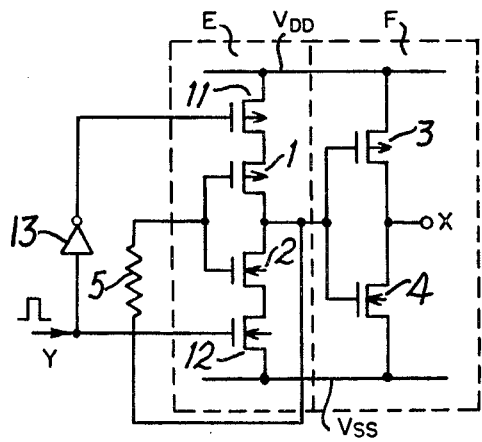
FIG.9
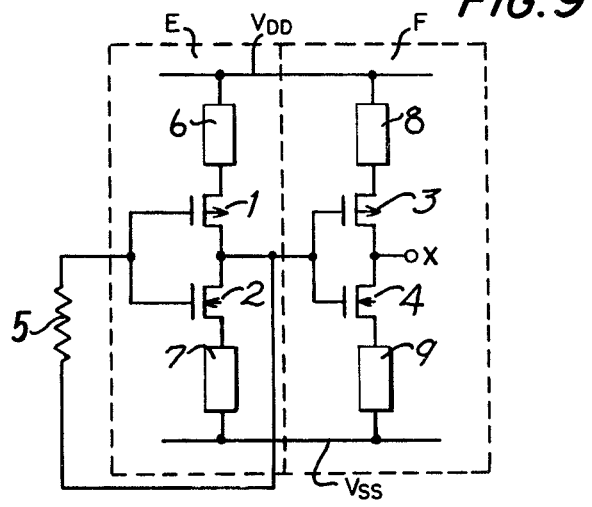

ELECTRONIC WATCH

FIELD OF INVENTION

The present invention relates to a circuit for detecting battery voltage and is particularly applicable to electronic watches but can also be applied to other equipment.

BACKGROUND OF THE INVENTION

In the prior art various types of battery voltage detecting circuits have been proposed. One such circuit uses a bipolar transistor so that it is difficult to manufacture this circuit in the IC for a timepiece using MOS transistors. Other prior art battery voltage detecting circuits require adjusting resistance for adjusting battery voltage detection and the temperature characteristics are not good. In particular the operation for controlling resistance and combining a detection setting voltage therewith is difficult.

SUMMARY OF THE INVENTION

It is an object of the present invention to provide a battery voltage detecting circuit which overcomes the disadvantages of prior art circuits. The invention provides a battery voltage detecting circuit which can detect the battery voltage without control. Better results can be expected especially in the case of a silver battery or a peroxide battery.

In accordance with the present invention, the battery detecting circuit comprises two NOT circuits connected across the battery terminals. Each of the NOT circuits comprises a P-channel MOS transistor and an N-channel MOS transistor. The output of the first NOT circuit is connected to the input of the second NOT circuit and is also connected through a biasing resistance to the input of the first NOT circuit. The output of the second NOT circuit is connected to means for providing a visual indication when the output is inverted. When the value of the battery voltage drops below a predetermined value, the output of the second NOT circuit is inverted so as to actuate the indicating means and thereby provide an indication that the battery is nearing depletion.

BRIEF DESCRIPTION OF DRAWINGS

The nature, objects and advantages of the invention will be more fully understood from the following description in conjunction with the accompanying drawings in which:

FIGS. 1 to 4 are circuit diagrams showing conventional circuits for detecting battery voltage, FIG. 5 is a circuit diagram of a battery voltage detecting circuit in accordance with the present invention, FIGS. 6 and 7 are curves to which reference is made in explaining the operation of the circuit of FIG. 5, and FIGS. 8 and 9 are circuit diagrams of other embodiments of the present invention.

DESCRIPTION OF PRIOR ART

The prior art battery voltage detecting circuit shown in FIG. 1 uses a bipolar transistor so that it is difficult to manufacture this circuit in intergrated circuitry for a timepiece using MOS transistors. In other prior art circuits illustrated in FIGS. 2 to 4 adjustment of resistance is required for adjusting battery voltage detecting and the temperature characteristic is not good. The operation for controlling resistance and combining a detection setting voltage therewith is difficult.

DESCRIPTION OF PREFERRED EMBODIMENTS

An embodiment of the present invention is illustrated by way of example in FIG. 5 in which there is shown a battery voltage detecting circuit comprising two NOT circuits E and F. The NOT circuit E comprises a P-channel MOS transistor 1 and an N-channel MOS transistor 2. A biasing resistance 5 is connected between the output of the circuit and the input. The resistance 5 may be an active element if it acts as a resistance element. The NOT circuit F comprises a P-channel MOS transistor 3 and an N-channel MOS transistor 4. As seen in FIG. 5, both of the NOT circuits E and F are connected between the high voltage line $V_{DD}$ which is connected to the positive electrode of the battery and the low voltage line $V_{SS}$ which is connected to the negative electrode of the battery. The output of circuit E is connected to the input of circuit F while the output X of circuit F is the output of the battery voltage detecting circuit and is connected with means for providing a visual indication when the voltage of the battery fails below a predetermined level. For example when the battery voltage detecting circuit of the present invention is used in an analog electronic watch, the output X may be connected to the wave shaping circuit of the driving stepping motor. As will be explained below, the output from X is "1" when the battery voltage is normal and "0" when the battery voltage is low. When the output from X changes from "1" to "0" the driving pulses of the stepping motor are changed so that the motor changes from a one second stepping condition to a two second stepping condition, thereby giving an indication that the battery voltage is low. As applied to a digital electronic watch the output X may be connected to means for changing the color of the digital display of the watch, for example as disclosed in application Ser. No. 705,445 filed July 15, 1976, now U.S. Pat. No. 4,074,515. Alternatively, the output X may be connected to other visual display means, for example an LED or other light source which is switched ON when the battery voltage falls below a predetermined value.

The operation of the battery voltage detecting circuit in accordance with the present invention as illustrated in FIG. 5 will now be further explained with reference to FIGS. 6 and 7.

When the output of circuit E comprising the MOS transistors 1 and 2 is $V_{OUT}$, $$V_{OUT} = \frac{(V_{DD} - V_{TP})\alpha_1 + V_{TN}}{(\alpha_1 + 1)} \quad (1)$$

where:

$\alpha_1 = \sqrt{k_{n2}/k_{p1}}$ $V_{TP}$ is the threshold voltage of the transistor 1.

$V_{TN}$ is the threshold voltage of the transistor 2.

$V_{P1}$ is the conductive coefficient of the transistor.

$V_{n1}$ is the conductive coefficient of the transistor 2.

$V_{DD}$ is the supply voltage.

$V_{TP}$ and $V_{TN}$ are values determined in the manufacturing process. If $\alpha_1 = 1$, the relation of $V_{OUT}$ with respect to the supply voltage $V_{DD}$ is shown by line A in FIG. 6 in which the horizontal axis is the supply voltage and the vertical axis is $V_{OUT}$.

In the next place in NOT circuit F comprising MOS transistors 3 and 4, the input voltage $V_{GB}$ at which the output at output X is inverted is given by the equation $$V_{GB} = \frac{(V_{DD} - V_{TP})\alpha_2 + V_{TN}}{(\alpha_2 + 1)} \quad (2)$$

where: $\alpha_2 = \sqrt{kn_4/kp_3}$ $V_{TP}$ and $V_{TN}$ in equation (2) have the same value as in equation (1) since MOS transistors 3 and 4 are on the same chip as transistors 1 and 2.

Now if $\alpha_2 = 2$, the relation of $V_{GB}$ with respect to $V_{DD}$ is shown by line B in FIG. 6 where the horizontal axis represents the battery voltage $V_{DD}$ and the vertical axis represents $V_{GB}$.

As will appear from FIG. 6 when the value of $V_{DD}$ is larger than that at the intersecting point $V_x$ of lines A and B, the output X of FIG. 5 is lowered to "0" level because the value of $V_{OUT}$ is higher than that of $V_{GB}$. On the other hand, when the value of $V_{DD}$ is lower than that of $V_{GB}$, the output X of FIG. 5 becomes level "1" because the value of $V_{OUT}$ becomes lower than that of $V_{GB}$. Accordingly when $V_{DD}$ changes, the output from the circuit F shown in FIG. 5 is inverted at point $V_x$ in FIG. 6 from level "0" to level "1." The value of $V_x$ can thus be obtained from equations 1 and 2. Since $V_x$ is obtained when $V_{GB} = V_{OUT}$ the supply voltage when $V_{GB} = V_{OUT}$ is obtained from equations 1 and 2 as follows:

$$V_{DD} = V_{TP} + V_{TN} \quad (3)$$

The meaning of this equation is significant because firstly, the detecting voltage never depends on a transistor constant "k." This can be accomplished in a NOT circuit as shown in FIG. 5 simply by considering "$\alpha$" of the NOT circuit as $\alpha_1 \neq \alpha_2$. Secondly, the detecting voltage may be determined by adding $V_{TP}$ and $V_{TN}$ because the value of $V_{TP} + V_{TN}$ is well settled even though unevenness is produced in the respective values $V_{TP}$ and $V_{TN}$. The threshold voltage AT of the MOS transistor is represented by $$AT = \phi MS + \phi B - \frac{Q_{OX}}{C_{OX}} - \frac{Q_B}{C_{OX}} \quad (4)$$

where:

$\phi MS$ is the work function difference in the gate portion.

$\phi B$ is the bending of a band when a channel commences to invert.

$C_{OX}$ is the electrostatic capacity of the gate oxide film.

$Q_{OX}$ is the electric charge in the oxide film or a boundary surface.

$Q_B$ is a fixed electric charge in the depletion electric charge.

In equation (4) if the threshold values of the P-channel MOS transistor and the N-channel MOS transistor exist in the same chip, the values of $Q_B$ are different from one another and polarities thereof are opposite to each other. Therefore the value of $V_{TP} + V_{TN}$ is relatively stabilized without unevenness. This value in a general process for an electronic watch is situated in the range of about 1.2 V. to 1.4 V. which is a little different in accordance with the process but an optimum value for instance as a value of detecting battery life.

In the next place, the temperature characteristics of the circuit of the present invention will now be described with reference to FIG. 7.

In order to obtain a satisfactory temperature characteristic, the solution concerning $V_{DD}$ may be gained as $2V_{DD}/2T = 0$ in equation (3). FIG. 7 shows the temperature characteristic of the MOS transistor in a saturating zone. Generally, the temperature coefficient of the threshold voltage (voltage between a gate and a power source in which $I_D = 0$) has a value of a few small mv/C. However, as clearly shown in FIG. 7, the temperature characteristic of the voltage between the gate and the power source has a zero point at a certain electric current value. When designing the present circuit the value "k" of the transistor may be determined in such manner that the values of $V_{OUT}$ and $V_{GB}$ in the circuits shown in FIG. 5 are points with zero temperature coefficient.

In order to reduce the power consumption of the battery voltage detecting circuit, a switching element is inserted so that the circuit is actuated only when a pulse of fixed period is applied thereto. An embodiment of such a circuit is illustrated by way of example in FIG. 8.

In the embodiment illustrated in FIG. 8, the switching circuit comprises a P-channel MOS transistor 11, an N-channel MOS transistor 12 and an inverter 13. A pulse of fixed period, for example from the frequency dividing circuit of a digital electronic watch, is applied to terminal Y. Hence, the battery voltage detecting circuit comprising MOS transistors 1-4 and resistance 9 is switched ON only when a pulse is applied to the terminal Y. The power consumption of the circuit is thereby reduced.

In case it is desired to set the value of the detecting voltage higher than that of $V_{TP} + V_{TN}$, the value of $V_{TP} + V_{TN}$ may be raised appropriately. An embodiment for accomplishing this is illustrated by way of example in FIG. 9.

In FIG. 9 as in FIGS. 5 and 8, the battery voltage detecting circuit comprises MOS transistors 1 to 4 and resistance 5. Elements 6,7,8 and 9 in FIG. 9 are voltage lowering elements e.g. resistances. In this way the source voltage of the transistors may be raised to adjust the threshold voltage appropriately or a fixed voltage may be applied to a substrate to raise the threshold voltage due to the substrata effect.

It will be understood that the pulse controlled switching circuit illustrated in FIG. 8 may also be applied to the embodiment illustrated in FIG. 9.

As will appear from the foregoing description, the present invention permits the cost of the battery voltage detecting circuit to be reduced below that of conventional circuits because the circuit in accordance with the present invention detects the battery voltage without control.

Furthermore, the bias resistance 5 shown in FIG. 5 may be composed of an MOS transistor which allows the chip area to be reduced since no elements such as diffusing resistance occupying a large area of the IC chip are required. For instance a circuit for detecting the battery life in a crystal clock may be simply and easily practiced.

It will be understood that the invention is in no way limited to the illustrated embodiments and that the invention may be applied not only to an electronic watch but also to other battery powered equipment.

What is claimed is:

1. A circuit for detecting battery voltage comprising first and second NOT circuits connected between positive and negative terminals of a battery, each of said circuits comprising a P-channel MOS transistor and an N-channel MOS transistor, means connecting the output of said first NOT circuit to the input of said second NOT transistor and resistance means interconnecting the output and input of said first NOT circuit, the output of said second NOT circuit being the output of said battery voltage connecting circuit for connection to indicating means.

2. A battery voltage detecting circuit according to claim 1, further comprising pulse controlled electronic switch means for intermittently connecting said first NOT circuit to a battery only when a pulse is applied to said switch means.

3. A battery voltage detecting circuit according to claim 1, comprising means for shifting the voltage detecting level of said voltage detecting circuit.

4. A battery voltage detecting circuit according to claim 1, in which each of said NOT circuits comprises a P-channel MOS transistor having its source connected with the positive terminal of said battery, an N-channel MOS transistor having its drain connected with the drain of said P-channel MOS transistor and its source connected with the negative terminal of said battery and means connecting the gates of said transistors with one another, the common drain connection of said transistors constituting the output of said NOT circuit.

5. A battery voltage detecting circuit according to claim 4, in which said resistance means connects the common drain of said MOS transistors comprising said first NOT circuit with the common gate connection of said MOS transistors comprising said first NOT circuit.

6. A battery voltage detecting circuit according to claim 4, further comprising pulse controlled switch means for connecting said first NOT circuit to said battery intermittently, said switch means comprising a second P-channel MOS transistor connecting the source of said P-channel MOS transistor of said first NOT circuit with said positive terminal, a second N-channel MOS transistor connecting the source of said N-channel MOS transistor of said first NOT circuit with said negative terminal, means including an inverter connecting the gates of said second P-channel MOS transistor with the gate of said second N-channel MOS transistor and means for supplying an intermittent pulse to the gate connections of said second P-channel transistor and said second N-channel transistor.

7. A battery voltage detecting circuit according to claim 4, further comprising a voltage lowering element connected between the source of each of said MOS transistors and respective ones of said battery terminals.

* * * * *